United States Patent
Dubhashi et al.

[11] Patent Number: 5,838,185
[45] Date of Patent: Nov. 17, 1998

[54] MULTIPLE INDIVIDUAL KELVIN EMITTER CONNECTIONS TO REDUCE CURRENT FLOW THROUGH PARASITIC DIODE

[75] Inventors: Ajit Dubhashi, El Segundo; Tyler Fure, Hermosa Beach, both of Calif.

[73] Assignee: International Rectifier Corporation, El Segundo, Calif.

[21] Appl. No.: 794,658

[22] Filed: Feb. 3, 1997

Related U.S. Application Data

[60] Provisional application No. 60/014,022 Mar. 25, 1996.
[51] Int. Cl.$^6$ ............................................. H03K 17/92
[52] U.S. Cl. .............................. 327/382; 327/372
[58] Field of Search .................................. 327/372, 382

[56] References Cited

U.S. PATENT DOCUMENTS

| | | | |
|---|---|---|---|
| 4,670,833 | 6/1987 | Sachs | 363/132 |
| 5,142,433 | 8/1992 | Nishibe et al. | 361/117 |
| 5,397,878 | 3/1995 | Chen | 219/661 |
| 5,412,332 | 5/1995 | Heeringa et al. | 327/110 |

FOREIGN PATENT DOCUMENTS

| | | |
|---|---|---|
| 0166968 | 1/1986 | European Pat. Off. . |
| 0609531 | 8/1994 | European Pat. Off. . |
| 0622892 | 11/1994 | European Pat. Off. . |

*Primary Examiner*—David C. Nelms
*Assistant Examiner*—Hoai Ho
*Attorney, Agent, or Firm*—Ostrolenk, Faber, Gerb & Soffen, LLP

[57] ABSTRACT

In a motor controller circuit, an integrated circuit driver drives a plurality of switching transistors which are organized along a top rail and a bottom rail. To reduce the conduction of current through the parasitic diode $D_{S1}$ of the integrated circuit, the switching transistors at the bottom rail are provided with individual Kelvin emitter connections, which reduce the parasitic internal inductances, which otherwise produce highly negative voltages when the top rail transistors are turned off. Further, individual traces are provided on the printed circuit board from the COM terminal to the Kelvin emitters. Finally, a small resistance is provided in series with each Kelvin emitter connection which increases the resistance in series with the parasitic diodes and hence reduces the current flowing in the parasitic diodes.

6 Claims, 1 Drawing Sheet

FIG. 1
Prior Art
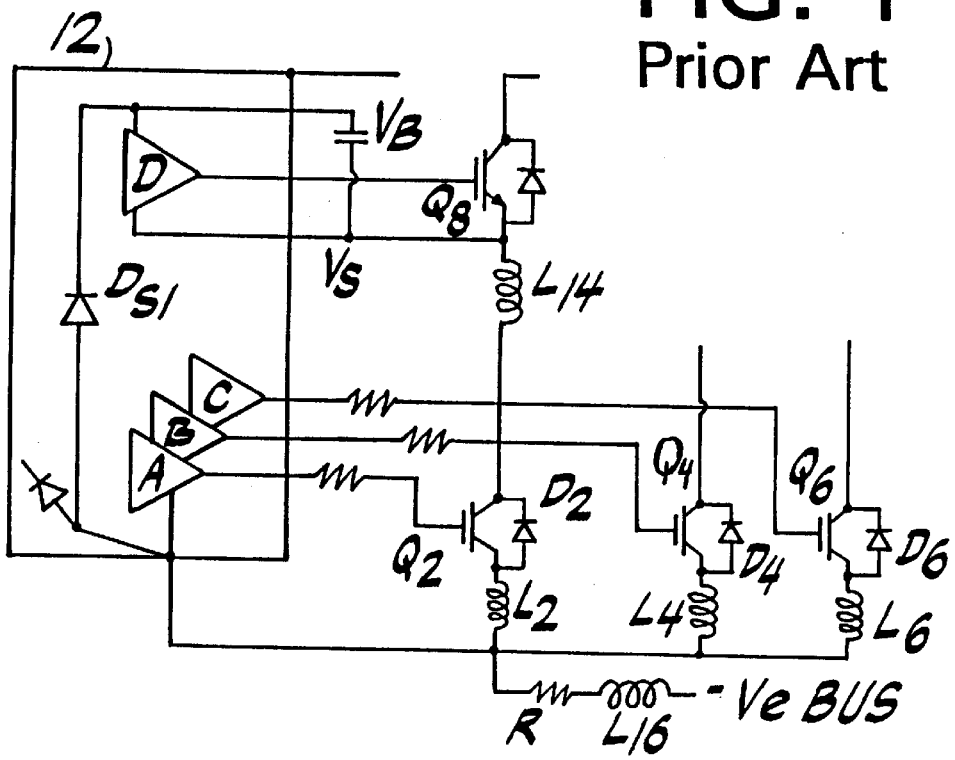
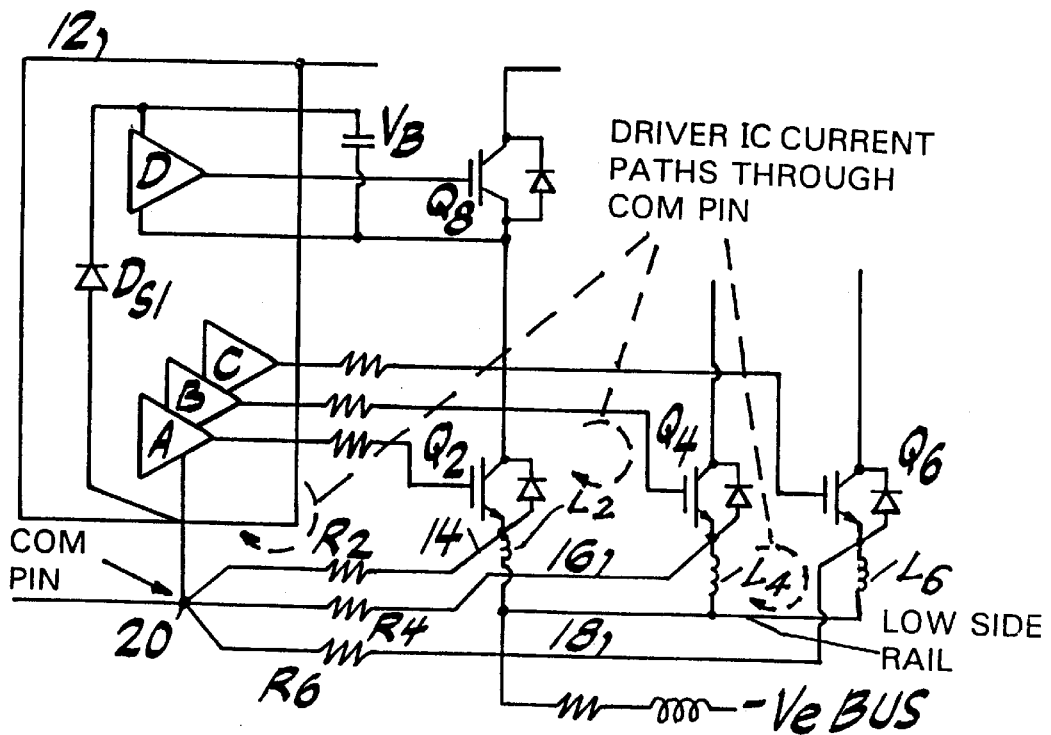
FIG. 2

MULTIPLE INDIVIDUAL KELVIN EMITTER CONNECTIONS TO REDUCE CURRENT FLOW THROUGH PARASITIC DIODE

RELATED APPLICATIONS

This application claims the benefit of U.S. Provisional application Ser. No. 60/014,022 filed on Mar. 25, 1996.

BACKGROUND OF THE INVENTION

The present invention relates to an inverter circuit for driving a load such as a motor and, more particularly, to an improved inverter circuit which reduces current flow through a parasitic diode.

FIG. 1 shows the layout of a portion of a typical integrated circuit for a motor controller, in which reference letters A, B, and C identify the drivers that drive IGBT/MOSFET switching transistors $Q_2$, $Q_4$, $Q_6$ at the bottom rail.

Since this type of integrated circuit ordinarily has only one terminal or output pin to the common point (the COM pin), the usual practice is to connect all the emitters of the devices to a common point and connect that point to the COM terminal. This causes a problem, however, as described below.

When a switching transistor on the "top" rail (e.g. $Q_8$ in FIG. 1) turns off, it causes the output current to be diverted to the diode coupled across the corresponding LOW SIDE switching transistor, i.e. diode $D_2$ in FIG. 1. In practice, due to the finite trace lengths of the connection on the circuit board, stray inductances are present, such as those identified by reference letters $L_2$, $L_4$, $L_6$, $L_{14}$, $L_{16}$, etc. in FIG. 1. These stray inductances are on the order of a few 10's of nano-Henries. These stray inductances, coupled with the high turn off di/dts (which are over 1000 A/$\mu$s) caused by the switching of the IGBT/MOSFETs, produces voltages at the $V_S$ pin that can be tens of volts of a –ve polarity with respect to COM.

This causes a parasitic diode $D_{S1}$ present between $V_B$ and COM to become forward biased, resulting in the flow of current through parasitic diode $D_{S1}$ from COM to $V_B$. This current can flow in an uncontrolled fashion and may cause malfunction of the logic of the integrated circuit or even "latch up" of the integrated circuit chip due to thyristor action.

SUMMARY OF THE INVENTION

Accordingly, it is an object of the present invention to provide an improved driver circuit for switching transistors which helps protect uncontrolled current flow in the integrated circuit which would destroy the switching transistors.

It is a further object of the invention to provide a circuit of the above type which can be fabricated in a simple manner.

The foregoing and other objects of the invention are realized by an inverter circuit comprising an integrated driver circuit and a plurality of switching transistors which are laid out along a top rail and a bottom rail. The bottom rail switching transistors are provided with individual Kelvin emitter connections to the common terminal of the integrated circuit to reduce the parasitic inductances. Further, individual traces are provided on the printed circuit board from the COM terminal to the Kelvin emitters. Still further, a small resistance (a few ohms) is provided in series with each Kelvin emitter connection.

Other features and advantages of the present invention will become apparent from the following description of the invention which refers to the accompanying drawings.

BRIEF DESCRIPTION OF THE DRAWINGS

FIG. 1 shows the circuit diagram of a portion of a typical integrated circuit for a motor controller.

FIG. 2 shows the circuit diagram of the present invention with multiple individual Kelvin emitter connections for the switching transistors at the bottom rail.

DETAILED DESCRIPTION OF THE PREFERRED EMBODIMENT

The problem described above, i.e. conduction of current through the parasitic diode $D_{S1}$ of the integrated circuit (IC) driver 12, can be reduced by utilizing the following circuit and layout criteria:

1. The switching transistors $Q_2$, $Q_4$, $Q_6$ at the bottom rail are provided with individual Kelvin emitter connections to the COM terminal of the integrated circuit, as shown in FIG. 2. This reduces the parasitic inductance $L_2$, $L_4$, $L_6$ of the emitter leads to a large extent (typically to sub nanoHenries). In practice, this is achieved by a separate connection from the common point or from the anode of the diode. Thus, the first criteria refers to the connection to each of the three IGBTs on the low side. Connecting the traces as close to the device as possible reduces the parasitic inductance as seen by the driver in the high current path.

2. Individual traces 14, 16, 18 are provided on the printed circuit board from the COM terminal 20 to the Kelvin emitters, rather than a single, joined trace as shown schematically in FIG. 1. The second criteria refers to the location in which to join the three traces. Keeping these traces separate on the printed circuit board, right up to the driver IC separates the impedances of each gate drive.

3. A small resistance (a few ohms, e.g., 1–10 Ω) $R_2$, $R_4$, $R_6$ is provided in series with each Kelvin emitter connection. This adds increased resistance in series with the parasitic diodes and hence reduces the current flowing in the parasitic diodes, thereby increasing the malfunction threshold.

FIG. 2 illustrates a top rail transistor $Q_8$ and bottom rail transistors $Q_2$, $Q_4$, $Q_6$. Note that the aforementioned attributes and benefits of the invention are applicable to a circuit in which only top rail and/or bottom rail transistors are driven.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A driving circuit for driving a load, comprising:
    a top rail and a bottom rail and at least one transistor arranged along the bottom rail;
    an integrated circuit driver coupled to and serving for turning the at least one switching transistor at the bottom rail on and off, wherein the integrated circuit driver has a COM pin and includes at least one parasitic diode;
    and wherein each of at least one switching transistor at the bottom rail has an emitter connected to the bottom rail by a trace and has associated therewith a respective parasitic inductance relating to the length of the trace; and
    wherein the at least one switching transistor at the bottom rail is provided with an individual Kelvin emitter connection from the COM pin of the integrated circuit driver to the emitter of the transistor to reduce the parasitic inductance, as seen by the integrated circuit driver, which is associated with the at least one bottom rail switching transistor and which relates to the length of the trace of the connection between the emitter and the bottom rail.

2. The driving circuit of claim 1, comprising a plurality of switching transistors including the at least one transistor arranged along the bottom rail and including at least one transistor arranged along the top rail.

3. The driving circuit of claim 2, in which the integrated circuit driver is also coupled to and serve to turn the at least one switching transistor arranged at the top rail.

4. The driving circuit of claim 3, further comprising a printed circuit board on which the integrated circuit and the switching transistors are mounted, the integrated circuit driver comprising a COM terminal and including individual circuit board traces from the COM terminal to the Kelvin emitter connection.

5. The driving circuit of claim 1, further comprising a respective small resistance of a few ohms connected in series with each Kelvin emitter connection.

6. The driving circuit of claim 4, further comprising a respective small resistance of a few ohms connected in series with each Kelvin emitter connection.

\* \* \* \* \*